(12) United States Patent
Farooq et al.

(10) Patent No.: US 8,791,009 B2
(45) Date of Patent: Jul. 29, 2014

(54) METHOD OF FORMING A THROUGH-SILICON VIA UTILIZING A METAL CONTACT PAD IN A BACK-END-OF-LINE WIRING LEVEL TO FILL THE THROUGH-SILICON VIA

(75) Inventors: Mukta G. Farooq, Hopewell Junction, NY (US); Troy Lawrence Graves-Abe, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 563 days.

(21) Appl. No.: 13/154,905

(22) Filed: Jun. 7, 2011

(65) Prior Publication Data

US 2012/0315753 A1    Dec. 13, 2012

(51) Int. Cl.
*H01L 21/4763* (2006.01)

(52) U.S. Cl.
USPC ..... 438/618; 438/667; 438/672; 257/E23.067

(58) Field of Classification Search
CPC ........... H10L 2224/73265; H10L 2224/48227; H10L 23/481; H10L 23/49827; H10L 2224/94; H10L 2924/01029; H10L 2225/06541; H10L 2225/06513; H10L 2225/06517
USPC .................................. 438/618–648, 666–668
See application file for complete search history.

(56) References Cited

U.S. PATENT DOCUMENTS

| | | | |
|---|---|---|---|
| 7,816,231 B2 | 10/2010 | Dyer et al. | |
| 7,863,189 B2 | 1/2011 | Basker et al. | |
| 2009/0032951 A1 | 2/2009 | Andry et al. | |
| 2010/0032764 A1 | 2/2010 | Andry et al. | |
| 2010/0193964 A1 | 8/2010 | Farooq et al. | |
| 2010/0314758 A1 | 12/2010 | Wu et al. | |
| 2010/0323478 A1 | 12/2010 | Kuo | |
| 2011/0018107 A1* | 1/2011 | Bonifield et al. | 257/621 |

OTHER PUBLICATIONS

Li Li and J.E. Morris, "An Introduction to Electrically Conductive Adhesives," International Journal of Microelectronic Packaging, 1998, vol. 1, pp. 159-175, Overseas Publishers Association/N.V.
Chang et al., "TSV Process Using Bottom-up Cu Electroplating and its Reliability Test," 2nd Electronics System-Integration Technology Conference, ESTC, Sep. 1-4, 2008, pp. 645-650.
Lee et al., "3D Stacked Flip Chip Packaging with Through Silicon Vias and Copper Plating or Conductive Adhesive Filling," Proc. 55th Electronic Components & Technology Conference (ECTC), Orlando, FL, May 31-Jun. 3, 2005, pp. 795-801.
Li et al., "An Introduction to Electrically Conductive Adhesives," pp. 6-31. Date accessed Jan. 13, 2011 <http://web.cecs.pdx.edu/~jmorris/Research%20&%20Publications/Electrically%20Conductive%20Adhesives/Int%20J%20Microelectronics%20Packaging%201%20%281998%29%20159%20I-CA%20Introduction.pdf>.

(Continued)

*Primary Examiner* — H Tsai
(74) *Attorney, Agent, or Firm* — Abdul-Samad A. Adediran

(57) ABSTRACT

A method for fabricating through-silicon vias (TSVs) for semiconductor devices is provided. Specifically, the method involves utilizing copper contact pads in a back-end-of-line wiring level, wherein the copper contact pads act as cathodes for performing an electroplating technique to fill TSVs with plated-conductive material (e.g., copper) from an electroplating solution. Moreover, the method provides a way to fill high aspect ratio TSVs with minimal additional semiconductor fabrication process steps, which can increase the silicon area that is available for forming additional electronic components on integrated circuits.

9 Claims, 15 Drawing Sheets

(56) References Cited

OTHER PUBLICATIONS

Lim et al., "Optimized TSV Process Using Bottom-Up Electroplating without Wafer Cracks," Proceedings 60th Electronic Components and Technology Conference (ECTC), Jun. 1-4, 2010, pp. 1642-1646.

Roozeboom et al., "Through-wafer interconnect technology options for 3D SIP," Technical Presentation, EMC3D European Roadshow, Leuven, Jun. 26, 2007, 30 slides.

Shen et al., "A Clamped Through Silicon Via (TSV) Interconnection for Stacked Chip Bonding Using Metal Cap on Pad and Metal Column Forming in Via," 58th Electronic Components and Technology Conference, ECTC, May 27-30, 2008, pp. 544-549.

Song et al., "A Wafer-Level 3D Integration Using Bottom-Up Copper Electroplating and Hybrid Metal-Adhesive Bonding," IEEE International Interconnect Technology Conference, IITC 2009, Jun. 1-3, 2009, pp. 163-164.

Yim et al., "Review of Electrically Conductive Adhesive Technologies for Electronic Packaging." Electronic Materials Letters, vol. 2, No. 3, 2006, pp. 183-194.

* cited by examiner

METHOD OF FORMING A THROUGH-SILICON VIA UTILIZING A METAL CONTACT PAD IN A BACK-END-OF-LINE WIRING LEVEL TO FILL THE THROUGH-SILICON VIA

TECHNICAL FIELD

The present invention relates to integrated circuits, and more particularly to through-silicon vias for three-dimensional (3D) integrated circuits.

BACKGROUND

Advancements in the area of semiconductor integrated circuit fabrication have enabled the manufacturing of integrated circuits that have a high density of electronic components, wherein the electronic components include capacitors, diodes, resistors and transistors. As the density of electronic components on integrated circuits increases, the number and length of interconnect wirings between the electronic components also increase. However, a challenge arises wherein an increase in the number and length of interconnect wirings can cause an increase in circuit resistance-capacitance (RC) delay and power consumption, which can negatively impact circuit performance.

Three-dimensional (3D) integrated circuits have been created to address the challenge discussed above. Generally, in a typical fabrication process of 3D integrated circuits at least two wafers, each including an integrated circuit, are formed. The wafers are vertically stacked and bonded together, and the electronic components of the integrated circuits on the wafers are appropriately aligned. Vertically stacked wafers can reduce interconnect wiring length. In addition, deep through-silicon vias (TSVs) are formed to provide interconnections and electrical connectivity between the electronic components on the vertically stacked wafers. Thus, an increase in device density of integrated circuits and a reduction of total interconnection wiring length can be achieved using 3D integrated circuit technology.

However, fabricating and filling high aspect ratio TSVs without pinch-off has presented challenges. Pinch-off refers to build up of deposited material at an opening of a trench or a via hole (e.g., TSV). Pinch-off can result in void formation, wherein parts of a trench surface area and/or parts of a via hole (e.g., TSV) are not filled with the deposited material. Void formation can result in an open circuit if one or more voids formed are large enough to sever the interconnect structure. Thus, void formation can reduce integrated circuit performance, decrease reliability of interconnects, cause sudden data loss, and reduce the useful life of semiconductor integrated circuit products. In addition, pinch-off can result in entrapment of undesired process chemicals within a trench or a via hole (e.g., TSV).

Accordingly, despite achievements that have been made in 3D integrated circuit technology, to increase device density and reduce the length of interconnection wiring, the challenge of fabricating and filling high aspect ratio TSVs without void formation and chemical entrapment continues to persist.

SUMMARY

The present invention relates to a method to form through-silicon vias (TSVs) for three-dimensional (3D) integrated circuits, which includes TSVs that have a high aspect ratio. The aspect ratio of a TSV refers to the ratio of the depth of the TSV to minimum lateral dimension of the TSV. TSVs are filled with plated-conductive material by performing an electroplating technique that utilizes one or more contact pads in a back-end-of-line (BEOL) wiring level to fill the TSVs. Specifically, TSVs can be filled with plated-conductive material (e.g., copper) by applying an electrical current to one or more contact pads, wherein the electrical current causes the plated-conductive material from an electroplating solution to form on the one or more contact pads and fill the TSVs. The method of filling TSVs, disclosed herein, can also be referred to as a bottom-up electroplating technique. Thus, contact pads in a BEOL wiring level can be utilized to fill high aspect ratio TSVs by performing an electroplating technique, which can mitigate void formation and chemical entrapment with minimal additional semiconductor fabrication process steps. Utilization of high aspect ratio TSVs can increase the substrate area that is available for forming additional electronic components for integrated circuits, which can also increase the amount of functionality provided by the integrated circuits.

A first aspect of the embodiments provides a method of forming a via structure. The method begins with forming a through-silicon via in a substrate, wherein the substrate has a first-surface and a second-surface. A back-end-of-line (BEOL) wiring level is formed on the first-surface of the substrate, wherein the BEOL wiring level includes a contact pad. A photosensitive polyimide layer is formed on the BEOL wiring level. An opening is formed in the photosensitive polyimide layer. A ball limiting metallization (BLM) layer is formed on the opening in the photosensitive polyimide layer. An adhesive layer is formed on the photosensitive polyimide layer and the BLM layer. A mechanical support carrier layer is formed on the adhesive layer. An electrical path is formed through the mechanical support carrier layer, wherein the electrical path includes the contact pad. An electroplating technique is performed to fill the through-silicon via with a plated-conductive material.

A second aspect of the embodiments provides a method of forming a via structure. The method begins with forming a through-silicon via in a substrate, wherein the substrate has a first-surface and a second-surface. A back-end-of-line (BEOL) wiring level is formed on the first-surface of the substrate, wherein the BEOL wiring level includes a contact pad. A photosensitive polyimide layer is formed on the BEOL wiring level. An opening is formed in the photosensitive polyimide layer. A ball limiting metallization (BLM) layer is formed on the opening in the photosensitive polyimide layer. An adhesive layer is formed on the photosensitive polyimide layer and the BLM layer. A mechanical support carrier layer is formed on the adhesive layer. A conducting plate is placed on the mechanical support carrier layer. An electrical path is formed, through the mechanical support carrier layer and the adhesive layer, which connects the conducting plate to the contact pad. An electroplating technique is performed to fill the through-silicon via with a plated-conductive material.

A third aspect of the embodiments provides a method of forming a via structure. The method begins with forming a through-silicon via in a substrate, wherein the substrate has a first-surface and a second-surface. A back-end-of-line (BEOL) wiring level is formed on the first-surface of the substrate, wherein the BEOL wiring level includes a contact pad. A photosensitive polyimide layer is formed on the BEOL wiring level. An opening is formed in the photosensitive polyimide layer. A ball limiting metallization (BLM) seed layer is formed on the photosensitive polyimide layer and over the opening in the photosensitive polyimide layer. An adhesive layer is formed on the BLM seed layer. A mechanical support carrier layer is formed on the adhesive layer. An electrical path is formed through the mechanical support carrier layer, wherein the electrical path includes the contact pad. An electroplating technique is performed to fill the through-silicon via with a plated-conductive material.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

Figure 1A:
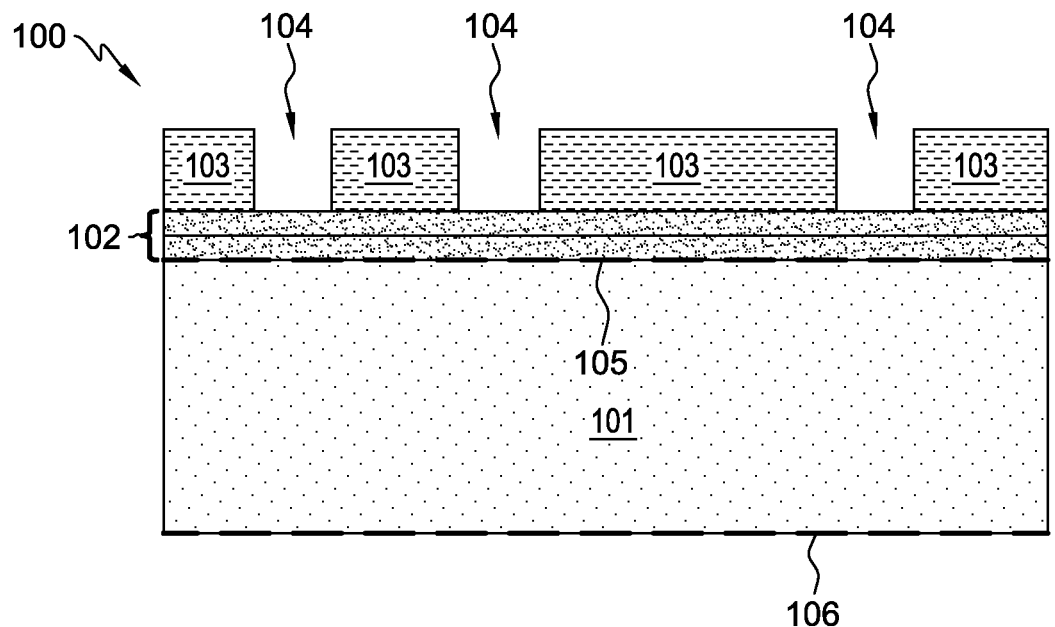
FIGS. 1A-1O are cross-sectional views of semiconductor structures illustrating process steps to form through-silicon vias (TSVs) for a three-dimensional (3D) integrated circuit, and to fill the TSVs with plated-conductive material utilizing one or more contact pads within a back-end-of-line wiring level according to one embodiment of the present invention.

The drawings are not necessarily to scale. The drawings, some of which are merely pictorial and schematic representations, are not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Moreover, although the embodiments depicted herein are shown in two dimensional views with various regions having width and depth, it should be clearly understood that these regions are illustrations of only a portion of a single unit of a device, which may include a plurality of such units arranged in three-dimensional structures.

References in the specification to "one embodiment", "an embodiment", "an example embodiment", "an alternative embodiment", "another embodiment", etc., indicate that the embodiment described may include a particular feature, element, structure, or characteristic, but every embodiment may not necessarily include the particular feature, element, structure, or characteristic. Moreover, such phrases are not necessarily referring to the same embodiment.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition, it will be understood that when an element as a layer, region, dielectric, or substrate is referred to as being "on" or "over", "disposed on", "disposed over", "deposited on", or "deposited over" another element, it can be directly on the other element or intervening elements may also be present. In contrast, when an element is referred to as being "directly on", "directly over", "directly proximate to", "disposed proximately to", or "deposited proximately to" another element, there are no intervening elements present. Furthermore, it will be understood that when an element as a layer, region, dielectric, or substrate is referred to as being "adjacent to" or "disposed adjacent to" another element, it can be directly adjacent to the other element or intervening elements may be present. In contrast, when an element is referred to as being "directly adjacent to" another element, there are no intervening elements present. Moreover, it will be understood that when an element as a layer, region, dielectric, or substrate is referred to as being "on and adjacent to" or "disposed on and adjacent to" another element, it can be directly on and adjacent to the other element or intervening elements may be present. In contrast, when an element is referred to as being "directly on and adjacent to" another element, there are no intervening elements present. Lastly, it will also be understood that when an element is referred to as being "attached", "connected", "coupled", or "joined" to another element, it can be directly attached, directly connected, directly coupled, or directly joined to the other element, or intervening elements may be present. In contrast, when an element is referred to as being "directly connected" or "directly coupled" to another element, there are no intervening elements present.

Embodiments of the present invention provide a method to fill through-silicon vias (TSVs) for three-dimensional (3D) integrated circuits, by using metal contact pads that are in a back-end-of-line (BEOL) wiring level. Specifically, the method involves utilizing the contact pads to perform an electroplating technique to fill TSVs and even high aspect ratio TSVs with plated-conductive material. Utilization of high aspect ratio TSVs can increase the silicon area that is available for forming additional electronic components on integrated circuits, which can also increase the amount of functionality provided by the integrated circuits. In the present embodiment the method is described in the context of forming TSVs during BEOL processing. However, the method described herein is also applicable to forming TSVs before front-end-of-line (FEOL) processing, during FEOL processing, after FEOL processing but before BEOL processing, after BEOL processing, or after mechanical support carrier-attach and backside thinning.

FIG. 1A illustrates a cross-sectional view of a semiconductor 100 having a substrate 101. Substrate 101 includes first-surface 105 and second-surface 106. Initial BEOL wiring level 102 is formed on first-surface 105 of substrate 101, and photoresist and/or hardmask 103 is deposited on the initial BEOL wiring level. Patterned openings 104 are formed in photoresist and/or hardmask 103 selective to initial BEOL wiring level 102 utilizing an etching/removal technique that includes, but is not limited to, dry etching, plasma etching, or reactive ion etching (RIE). Initial BEOL wiring level 102 includes BEOL dielectric layers and multiple metallization layers, wherein the metallization layers can provide electrical connections between semiconductor devices formed on substrate 101. Patterned openings 104 are created to clear the way for formation of TSVs, including high aspect ratio TSVs, for semiconductor 100. A high aspect ratio TSV refers to a TSV having a height and a width, wherein the height is relatively large compared to the width. Thus, high aspect ratio TSVs are tall and thin, and consume less silicon surface area. A high aspect ratio TSV may have a height that is typically 10 to 50 times larger than the width.

Figure 1B:
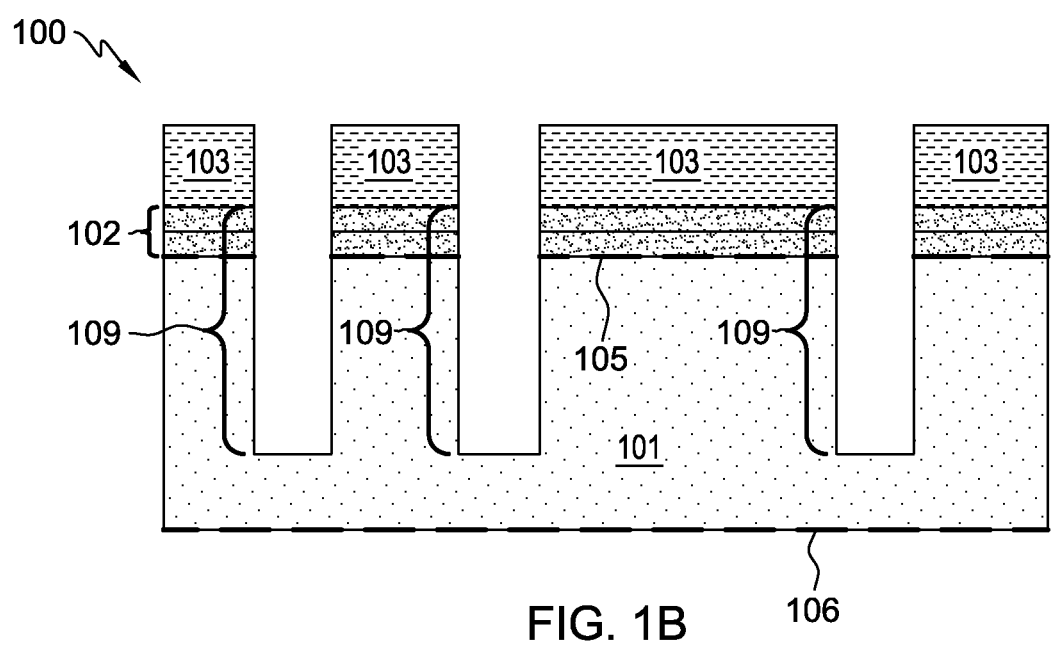
FIG. 1P is an alternative embodiment of semiconductor structures depicting a cross-sectional view of TSVs for a 3D integrated circuit, wherein controlled collapse chip connections (C4s) are present during the filling of the TSVs with plated-conductive material according to one embodiment of the present invention.
FIG. 1Q is an alternative embodiment of semiconductor structures depicting a cross-sectional view of TSVs formed in a substrate for a 3D integrated circuit before BEOL processing, or after mechanical support carrier-attach and backside thinning according to one embodiment of the present invention.
FIG. 1R is an alternative embodiment of semiconductor structures depicting a cross-sectional view of TSVs for a 3D integrated circuit, wherein a ball limiting metallization (BLM) seed layer is formed and is utilized in performing an electroplating technique to fill the TSVs with plated-conductive material according to one embodiment of the present invention.
FIG. 1S is an alternative embodiment of semiconductor structures depicting a cross-sectional view of TSVs for a 3D integrated circuit, wherein a conducting plate is coupled to feed-through conductors and is placed on a mechanical support carrier layer, and wherein the feed-through conductors connect the conducting plate to an electrical path that can be utilized to perform an electroplating technique to fill the TSVs with plated-conductive material according to one embodiment of the present invention.
FIG. 1T is an alternative embodiment of semiconductor structures depicting a cross-sectional view of TSVs for a 3D integrated circuit, wherein a conducting plate is coupled to feed-through conductors and is placed on a mechanical support carrier layer, and wherein the feed-through conductors connect the conducting plate to C4s as part of an electrical path that is utilized to perform an electroplating technique to fill the TSVs with plated-conductive material according to one embodiment of the present invention.

FIG. 1B illustrates a cross-sectional view of semiconductor 100 having TSVs 109 formed in initial BEOL wiring level 102 and substrate 101. TSVs 109 may be formed in initial BEOL wiring level 102 and substrate 101 utilizing an etching/removal technique that includes, but is not limited to, RIE. For example, TSVs 109 can be created by performing an anisotropic RIE of initial BEOL wiring level 102 and substrate 101.

Figure 1C:
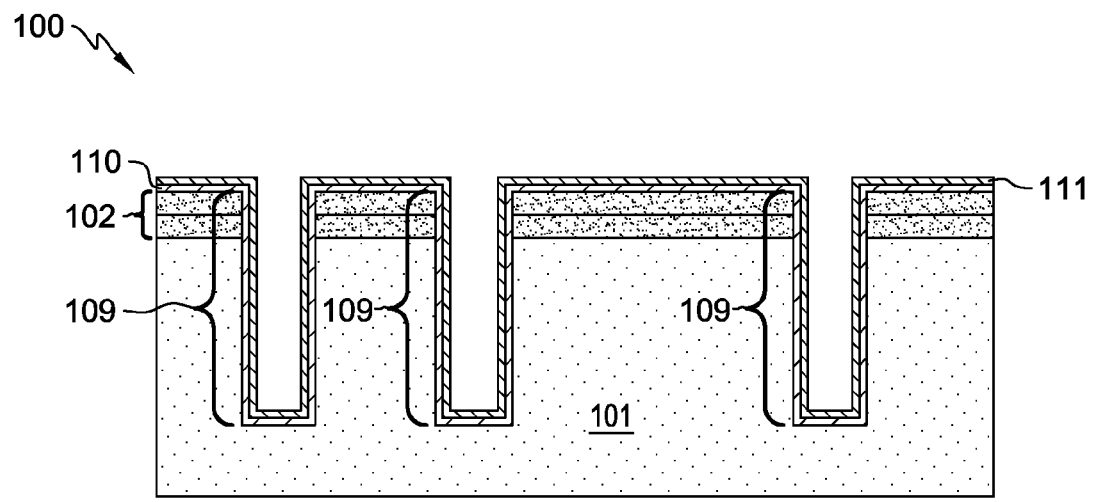

FIG. 1C illustrates a cross-sectional view of semiconductor 100 having an optional dielectric layer 110 deposited on and adjacent to initial BEOL wiring level 102 and substrate 101. Dielectric layer 110 can include an oxide such as silicon dioxide, a nitride such as silicon nitride, or a combination thereof. Dielectric layer 110 can electrically isolate conductive material, subsequently formed inside TSVs 109, from portions of substrate 101 to mitigate short circuiting. Dielectric layer 110 may be deposited on and adjacent to initial BEOL wiring level 102 and substrate 101 utilizing a chemical vapor deposition (CVD) technique. For example, sub-atmospheric chemical vapor deposition (SACVD) can be utilized to deposit dielectric layer 110 on and adjacent to initial BEOL wiring level 102 and substrate 101. Utilizing a CVD technique can minimize pinch-off by providing conformal deposition of dielectric layer 110 adjacent to sidewalls of TSVs 109. Pinch-off refers to build up of deposited material at openings of trenches or via holes (e.g., TSVs 109). Pinch-off can result in void formation, such that parts of a trench surface area and/or parts of a via hole surface area are not covered with the deposited material.

In addition, a diffusion barrier layer 111 may be deposited directly on and adjacent to dielectric layer 110, or directly on and adjacent to initial BEOL wiring level 102 and substrate 101 utilizing a deposition technique that can include CVD, physical vapor deposition (PVD), or atomic layer deposition (ALD). Diffusion barrier layer 111 can include tantalum (Ta), tantalum nitride (TaN), ruthenium (Ru), titanium (Ti), titanium nitride (TiN), or other materials that are capable of mitigating conductive material (e.g., copper) from diffusing into dielectric layer 110 and/or substrate 101. Diffusion of conductive material into dielectric layer 110 and/or substrate 101, can result in degradation of the electrical characteristics of any semiconductor devices fabricated on the substrate.

Figure 1D:
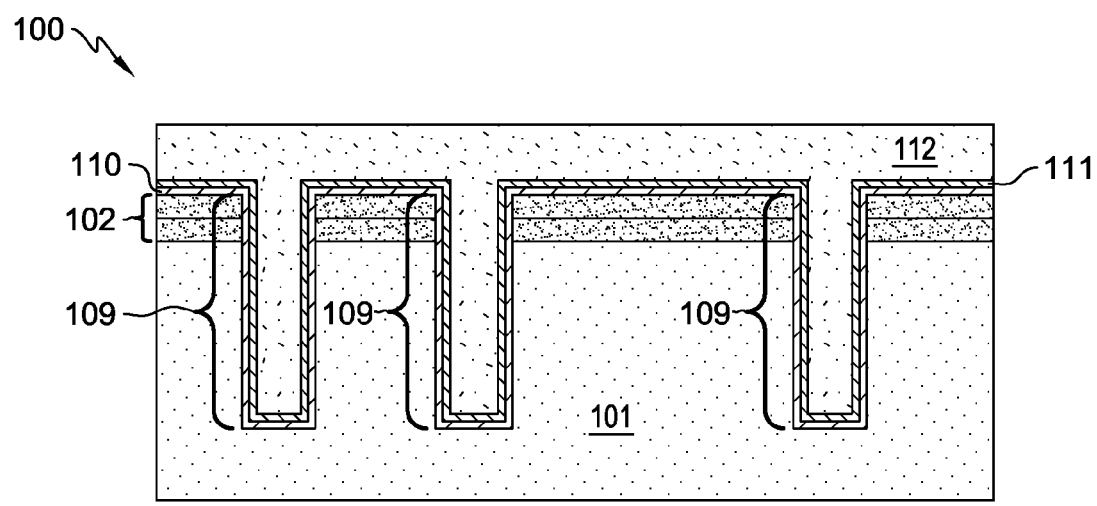

FIG. 1D illustrates a cross-sectional view of semiconductor 100 having sacrificial layer 112 deposited directly on and adjacent to diffusion barrier layer 111. Sacrificial layer 112 can include, but is not limited to, poly-silicon, polyimide, or an oxide. Sacrificial layer 112 can be formed by utilizing deposition techniques that can include CVD, PVD, or spin-on approaches. Utilizing sacrificial layer 112 allows for additional semiconductor fabrication processes to be completed prior to filling TSVs 109 with plated-conductive material (e.g., copper). Since sacrificial layer 112 will be removed at a later step, TSVs 109 are not required to be filled completely with the sacrificial layer.

Figure 1E:
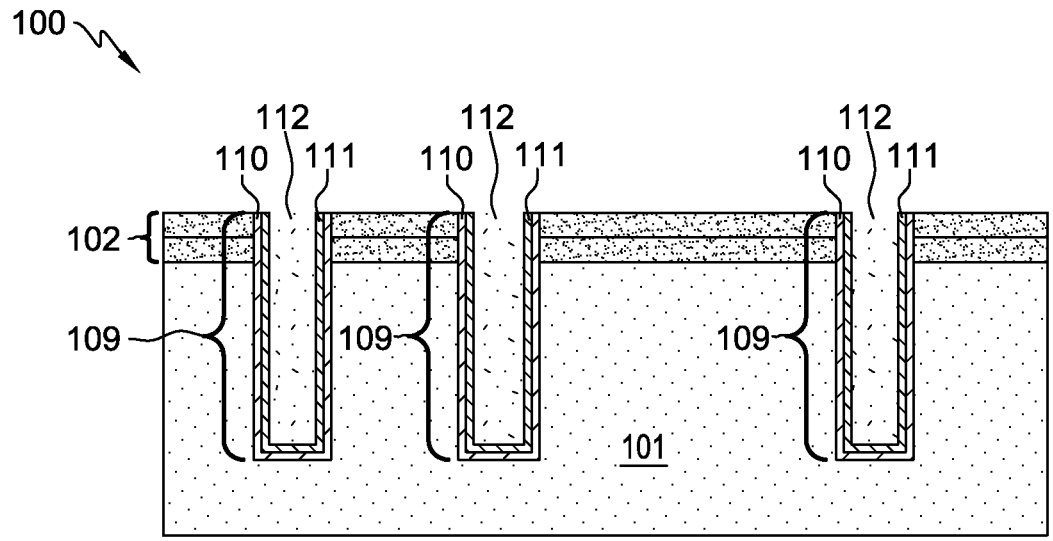

FIG. 1E illustrates an end result of a chemical-mechanical planarization (CMP) process performed on semiconductor 100. The CMP process removes a portion of dielectric layer 110, diffusion barrier layer 111, and sacrificial layer 112 selective to initial BEOL wiring level 102. However, dielectric layer 110, diffusion barrier layer 111, and sacrificial layer 112 remain in TSVs 109. Thus, the CMP process provides for the formation of a quality interconnect structure, and clears the way for forming an additional BEOL wiring level.

Figure 1F:
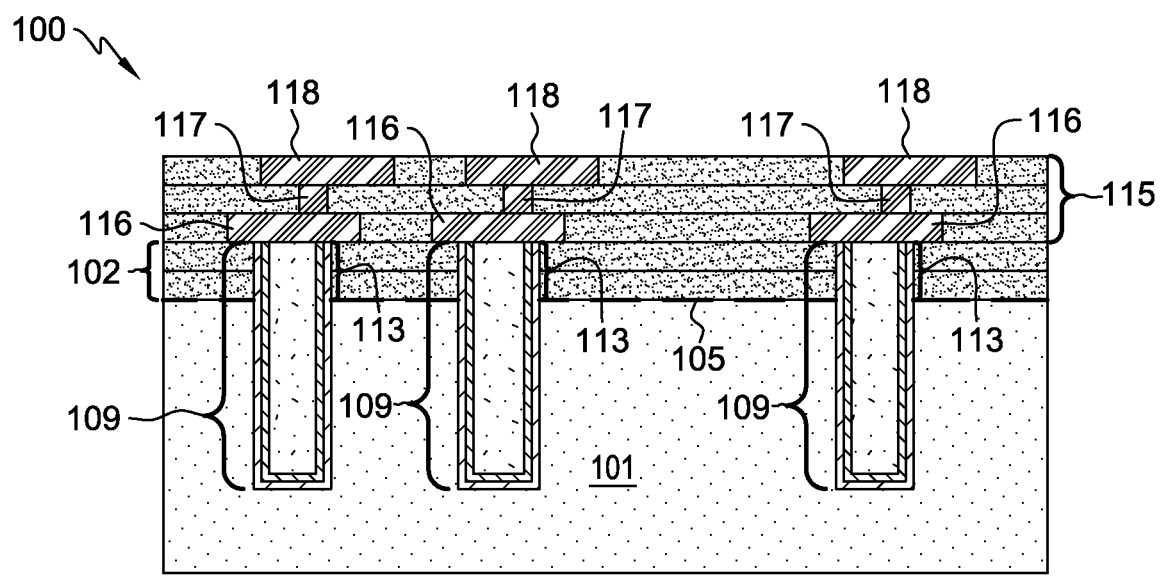

FIG. 1F illustrates a cross-sectional view of semiconductor 100 after additional BEOL wiring level 115 is deposited on initial BEOL wiring level 102 and on first end 113 of TSVs 109. Additional BEOL wiring level 115 includes BEOL dielectric layers and multiple metallization layers, wherein the metallization layers can provide electrical connections between semiconductor devices on substrate 101. The metallization layers include contact pads 116, and metal wiring layers 117-118. In the present embodiment, contact pads 116 and metal wiring layers 117-118 include copper, but the metal wiring layers can be formed utilizing other conductive materials, such as tungsten or aluminum. Contact pads 116 and metal wiring layers 117-118 are part of an electrical path to perform an electroplating technique that can be utilized to fill TSVs 109 with plated-conductive material (e.g., copper). Specifically, one or more contact pads 116 are disposed on TSVs 109, as part of the final semiconductor 100 structure, to fill the TSVs with plated-conductive material (e.g., copper) and enable the TSVs to communicate with BEOL wiring level 115 and initial BEOL wiring level 102. In addition, contact pads 116 can include a diffusion barrier layer to isolate the contact pads from surrounding dielectric in BEOL wiring level 102 and 115, wherein the diffusion barrier layer can include tantalum (Ta), tantalum nitride (TaN), ruthenium (Ru), titanium (Ti), titanium nitride (TiN), or other materials that are capable of mitigating conductive material (e.g., copper) from diffusing into the surrounding dielectric and/or substrate 101.

Figure 1G:
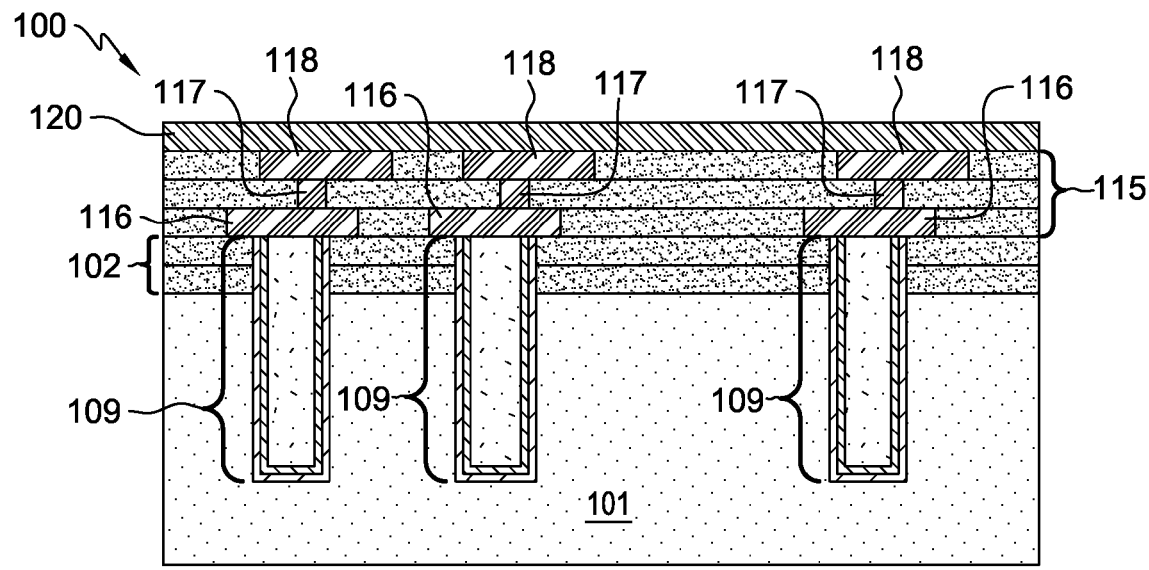

FIG. 1G illustrates a cross-sectional view of semiconductor 100, wherein photosensitive polyimide (PSPI) layer 120 is deposited on BEOL wiring level 115. The thickness of PSPI layer 120 may be about 1-10 μm. PSPI layer 120 is one example of an insulating dielectric that can be utilized, however other insulating dielectric materials, such as an oxide, may be utilized in place of the PSPI layer.

Figure 1H:
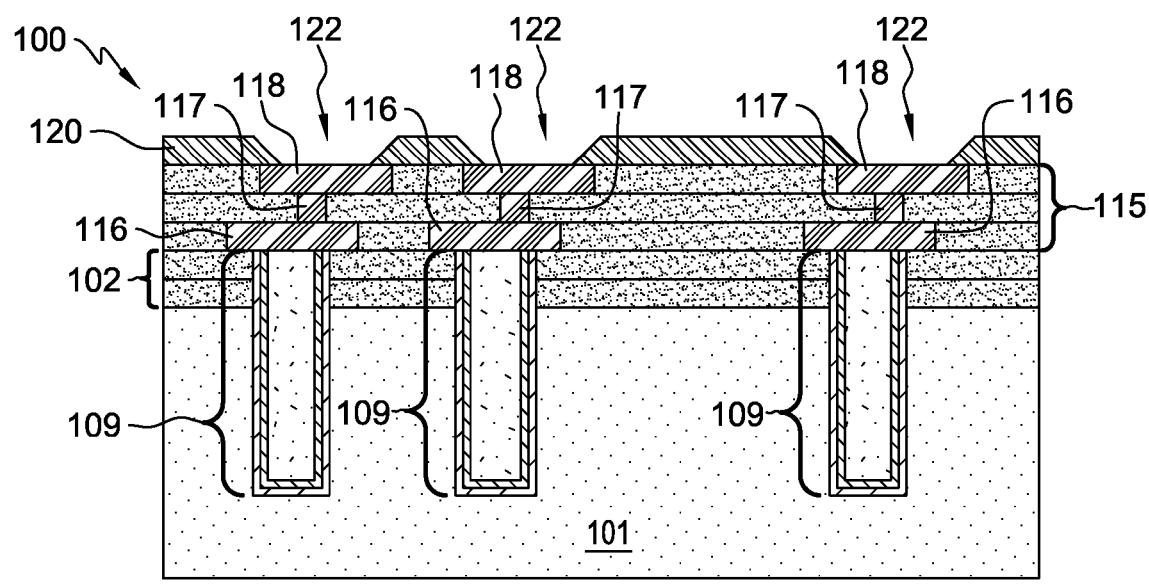

FIG. 1H illustrates a cross-sectional view of semiconductor 100 after PSPI layer 120 has been formed, wherein a masking pattern and etch has been utilized to form openings 122. Openings 122 may be formed in PSPI layer 120 by utilizing standard photolithography techniques.

Figure 1I:
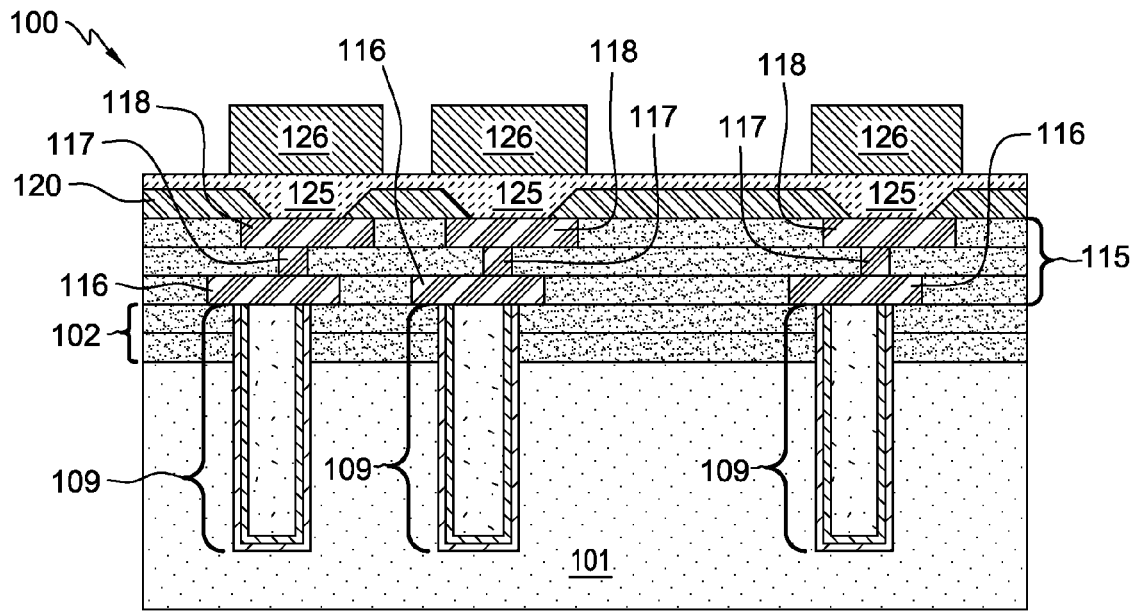

FIG. 1I illustrates a cross-sectional view of semiconductor 100, wherein ball limiting metallization (BLM) layer 125 is formed on PSPI layer 120, and on and adjacent to openings 122 (shown in FIG. 1H). Specifically, BLM layer 125 may be formed by plasma vapor deposition of an adhesion and/or barrier layer, and a seed layer. The seed layer is formed on PSPI layer 120 and on and adjacent to openings 122. The seed layer can include titanium-tungsten (TiW) and copper (Cu). Subsequently, electroplating of the seed layer can be performed to create BLM layer 125, followed by a polishing process to planarize the exposed surface of the BLM layer. Resist mask 126 can be patterned on BLM layer 125 to define the final shape of the BLM layer, and remove portions of the BLM layer that are on PSPI layer 120. BLM layer 125 can be utilized with contact pads 116 as part of an electrical path to perform an electroplating technique to fill TSVs 109 with plated-conductive material, for example copper.

Figure 1J:
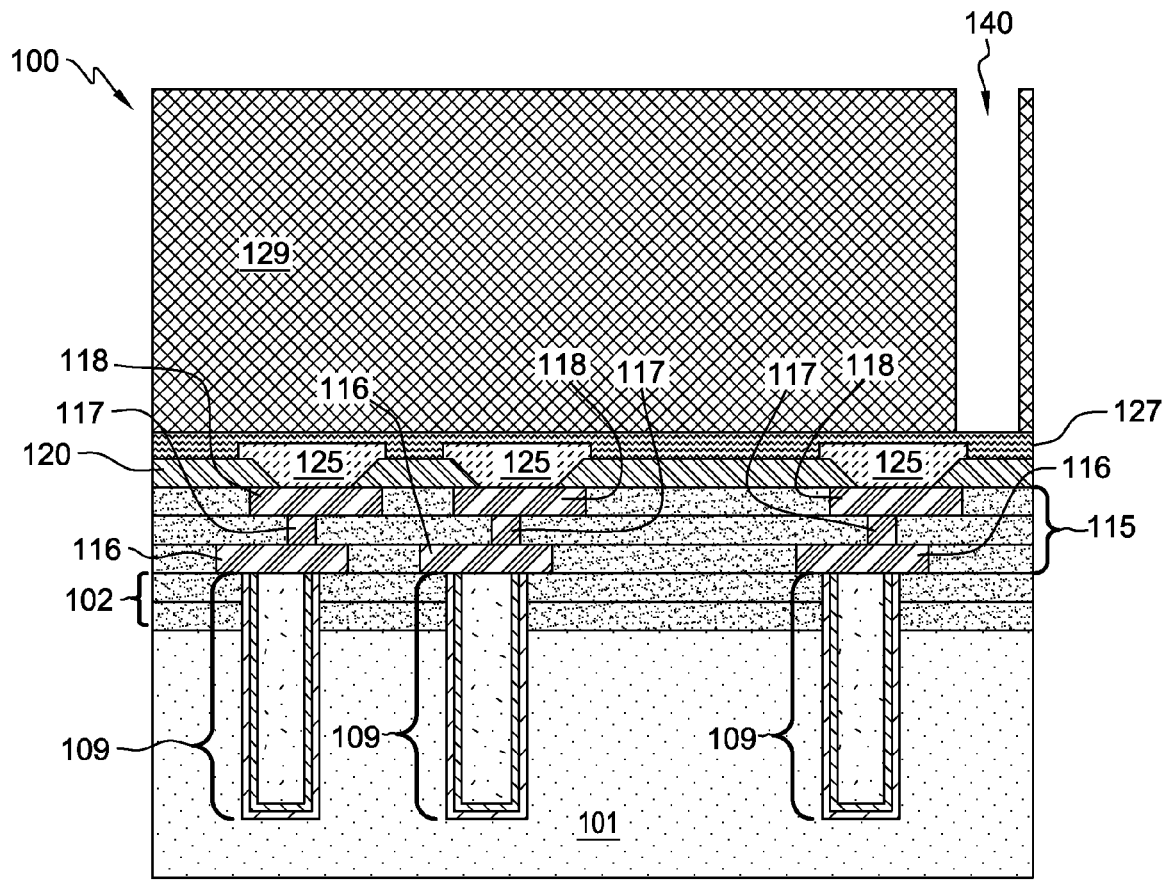

FIG. 1J illustrates a cross-sectional view of semiconductor 100, wherein resist mask 126 (shown in FIG. 1I) and a portion of BLM layer 125 (shown in FIG. 1I) are removed. In an alternative embodiment, the final shape of BLM layer 125, as shown in FIG. 1J, may be formed by performing the following steps: depositing an adhesion and/or bather layer and a seed layer (e.g., TiW and Cu) on PSPI layer 120 and on and adjacent to openings 122 (shown in FIG. 1H); depositing a resist mask to allow plating only over the openings; performing electroplating of the seed layer to create BLM layer 125 (shown in FIG. 1I); removing the resist mask; removing a portion of the BLM layer (shown in FIG. 1I). The aforementioned removal of a portion of BLM layer 125 may be achieved by a timed etch, or by utilizing another resist mask similar to resist mask 126 (shown in FIG. 1I). In the present embodiment, adhesive layer 127 is spin-applied on PSPI layer 120 and BLM layer 125, and mechanical support carrier layer 129 is joined to semiconductor 100 utilizing the adhesive layer. Alternatively, adhesive layer 127 can be spin-applied to a surface of mechanical support carrier layer 129, and then the adhesive layer can be utilized to join the mechanical support carrier to PSPI layer 120 and BLM layer 125. Adhesive layer 127 having a thickness of about 1-100 μm can include a polymer resin for example epoxy, ester, polyimide, or silicone. Moreover, since adhesive layer 127 is conductive the adhesive layer can include copper (Cu), nickel (Ni), or silver (Ag).

Mechanical support carrier layer 129 may include glass or silicon, which can provide structural support during subsequent semiconductor fabrication processing steps. The thickness of mechanical support carrier layer 129 is typically about 700-800 μm. Moreover, at least one opening 140 is already present in mechanical support carrier layer 129, or the opening is subsequently formed selective to adhesive layer 127.

Figure 1K:
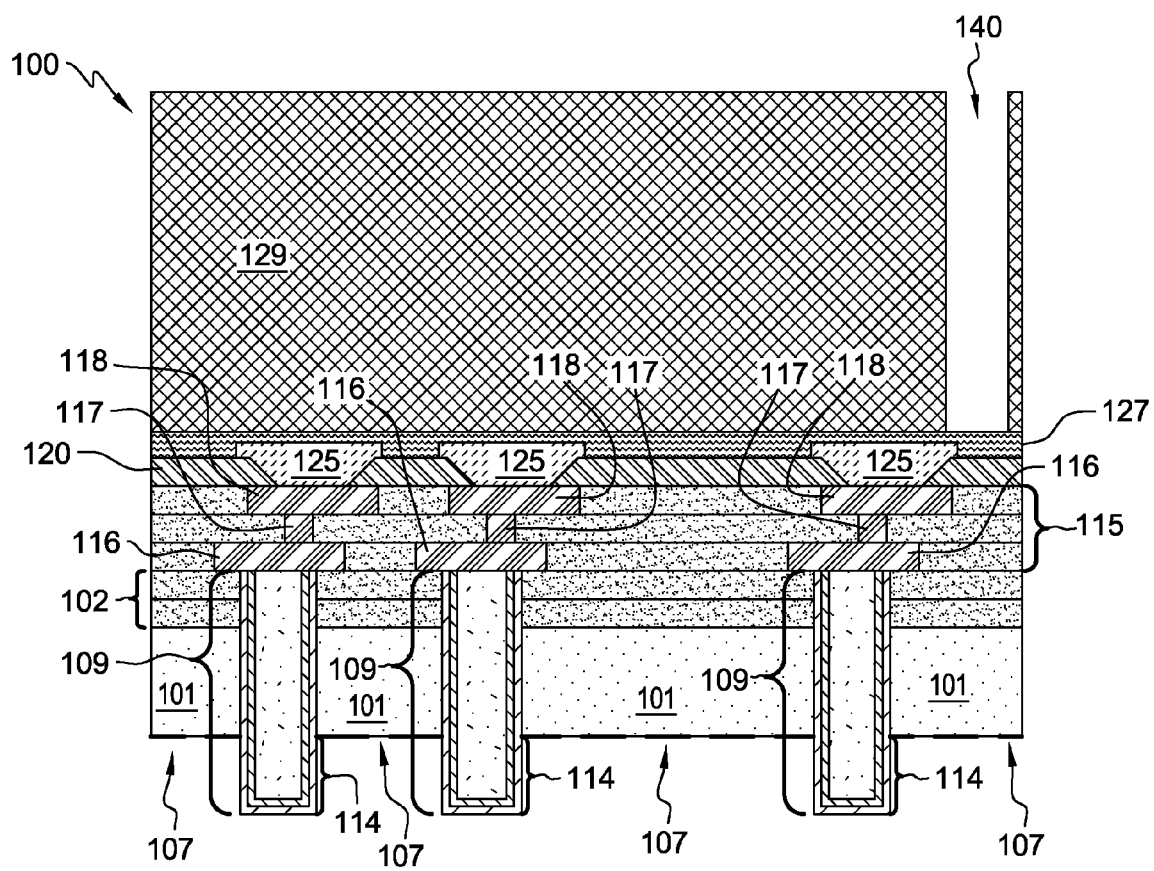

FIG. 1K illustrates a cross-sectional view of semiconductor 100 after recessing second-surface 106 (shown in FIG. 1B) of substrate 101 to form third-surface 107 of the substrate. Recessing second-surface 106 (i.e., backside thinning), of substrate 101, can be performed by subjecting the second-surface to grinding and polishing. RIE or wet etching may be used as a final step to expose second end 114 of TSVs 109.

Figure 1L:
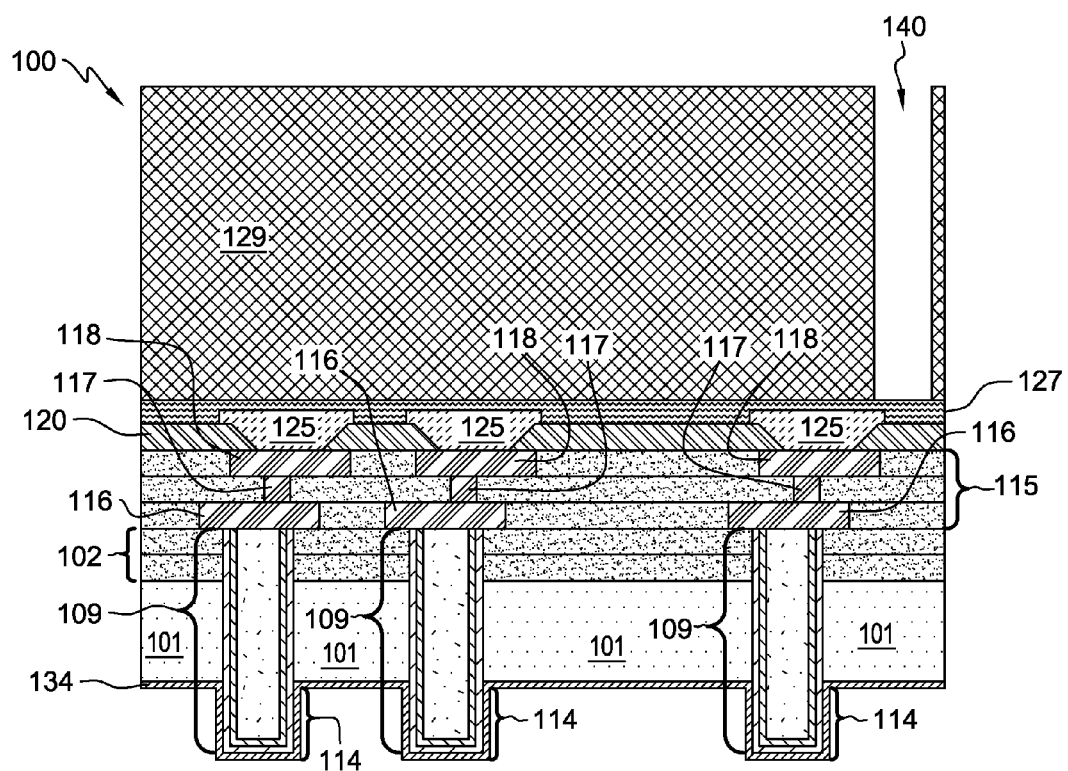

FIG. 1L illustrates a cross-sectional view of semiconductor 100, wherein dielectric layer 134 is deposited proximately to third-surface 107 (shown in FIG. 1K) of substrate 101, and proximate to second end 114 of TSVs 109. Dielectric layer 134 may include nitride, oxide, or a combination thereof. Nitride is typically utilized to mitigate the diffusion of conductive material (e.g., copper) into substrate 101, and oxide is typically utilized for adhesion, stress balancing, and as a CMP stop.

Figure 1M:
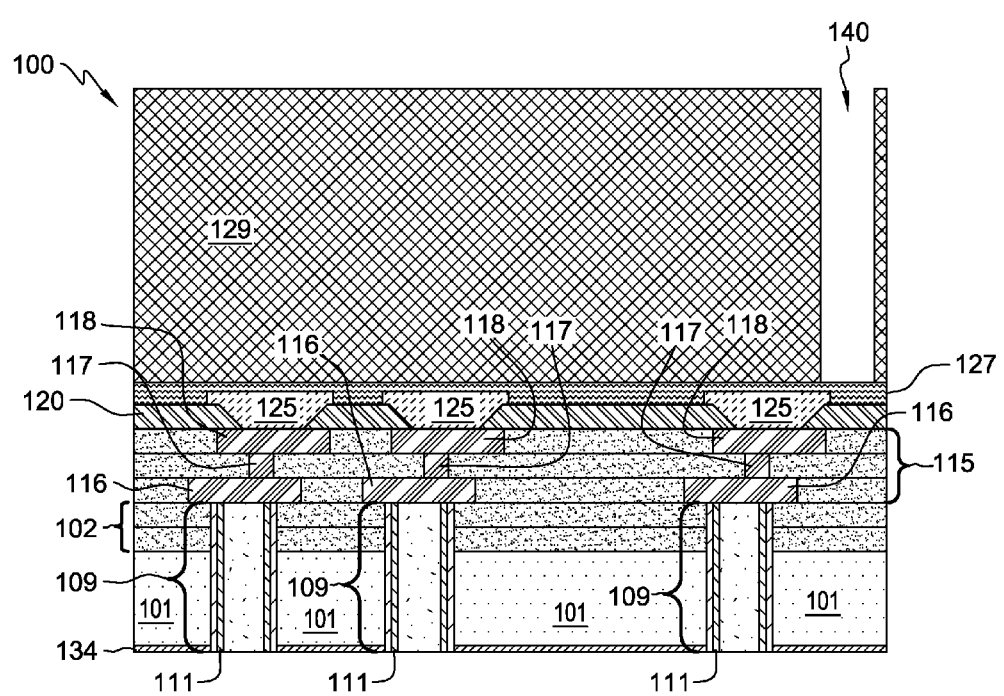

FIG. 1M illustrates an end result of a CMP process performed on semiconductor 100. Specifically, CMP is performed on semiconductor 100 to remove second end 114 (shown in FIG. 1L) of TSVs 109. Thus, the CMP that is performed shortens the height of TSVs 109.

Figure 1N:
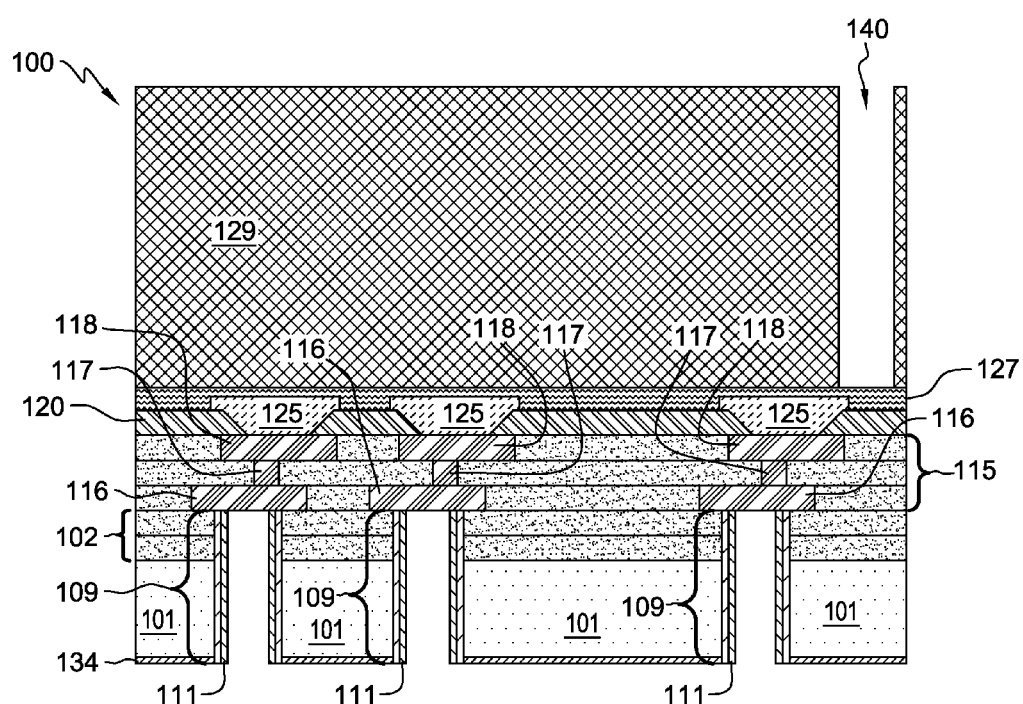

FIG. 1N illustrates an end result after removal of sacrificial layer 112 from TSVs 109. Thus, subsequent to the CMP that removes second end 114 (shown in FIG. 1L) of TSVs 109, sacrificial layer 112 is removed from the TSVs selective to contact pads 116 and to diffusion barrier layer 111. Reactive ion etching (RIE), such as anisotropic RIE, can be utilized to remove sacrificial layer 112 from TSVs 109. Optionally, the RIE may be further utilized to expose copper of contact pads 116 directly proximate to TSVs 109. However, the etching/removal technique utilized to remove sacrificial layer 112 does not remove dielectric layer 134, because the dielectric layer is resistant to the etching/removal technique.

Figure 1O:
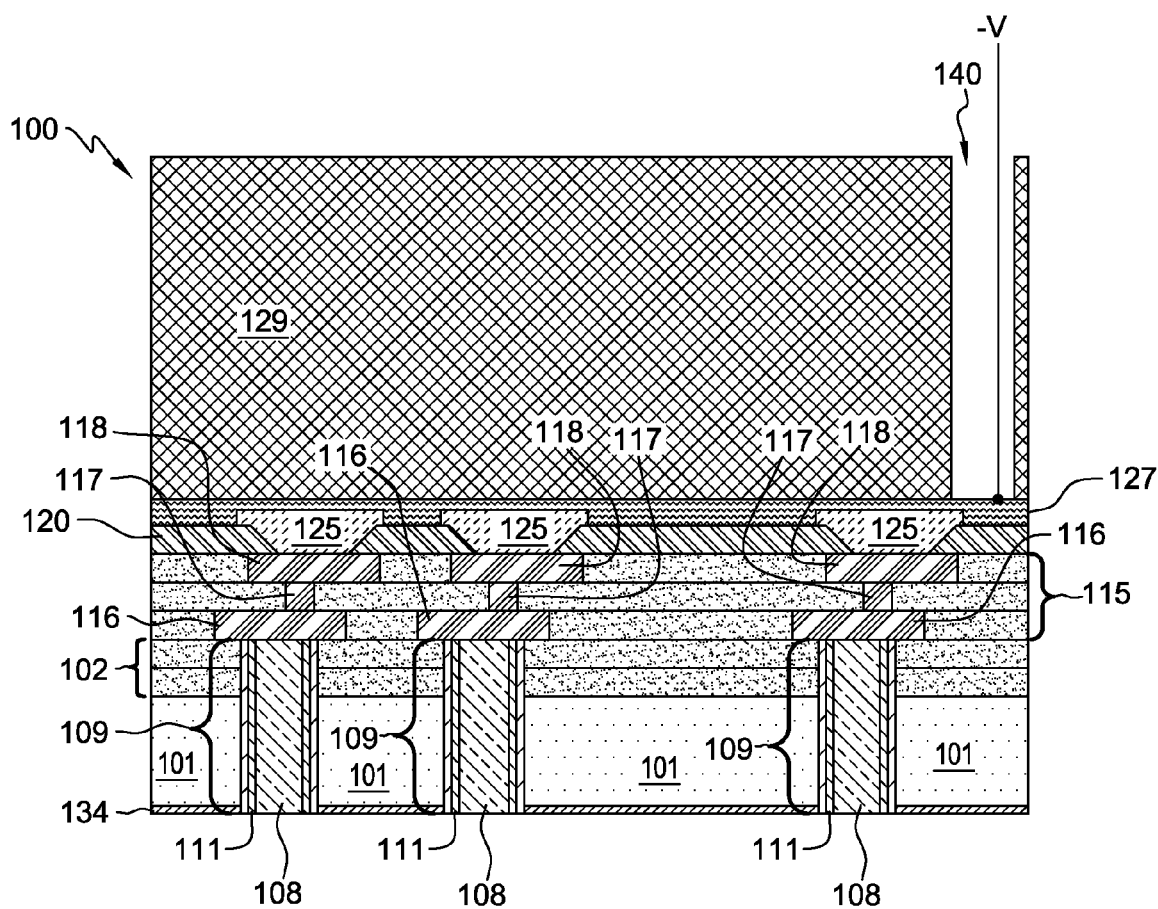

FIG. 1O illustrates a cross-sectional view of semiconductor 100 after performing an electroplating technique to fill TSVs 109 with plated-conductive material 108 (e.g., copper) deposited from an electroplating solution on contact pads 116. Contact pads 116 act as cathodes during the electroplating technique, wherein a negative voltage is applied through opening 140 in mechanical support carrier layer 129. Specifically, the negative voltage is applied to adhesive layer 127, which is part of an electrical path that further includes BLM layer 125, metal wiring layers 117-118, and contact pads 116. Thus, the electroplating technique causes electrical current to flow through the electrical path to contact pads 116 that act as cathodes. While performing the electroplating technique, contact pads 116 are in contact with an electroplating solution upon which plated-conductive material 108 (e.g., copper) from the electroplating solution deposits on the contact pads to fill TSVs 109. The electroplating solution can include, but is not limited to, copper sulfate ($CuSO_4$) or sulfuric acid ($H_2SO_4$). The electroplating technique can be performed until plated-conductive material 108 (e.g., copper) from the electroplating solution overfills and extends outside of TSVs 109. A CMP step can be utilized to remove any excess/overfill of plated-conductive material 108.

Since TSVs 109 are filled with plated-conductive material 108 (e.g., copper) from the electroplating solution that deposits starting on contact pads 116, the risk of void formation or pinch-off is minimized even with high aspect ratio TSVs. TSVs 109 that have a high aspect ratio can increase the area of substrate 101 that is available for forming additional electronic components, which can also increase the amount of functionality provided by integrated circuits.

Figure 1P:
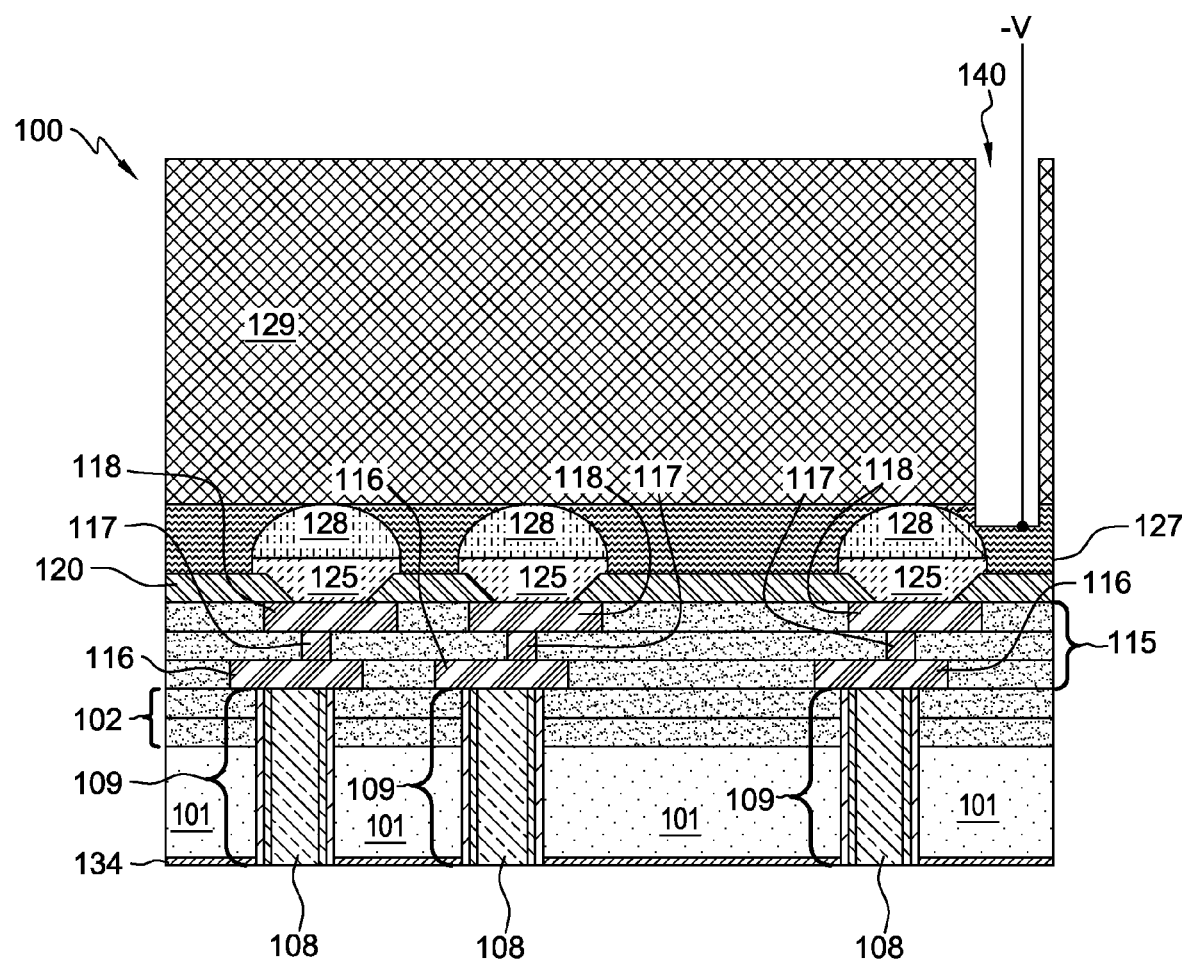

FIG. 1P is an alternative embodiment that illustrates a cross-sectional view of semiconductor 100 with C4s 128 formed on BLM layer 125. An electroplating technique is utilized to fill TSVs 109 with plated-conductive material 108 (e.g., copper) from an electroplating solution, wherein a negative voltage is applied through opening 140, formed in mechanical support carrier layer 129. Specifically, the negative voltage is applied to adhesive layer 127. Adhesive layer 127 is conductive and is part of an electrical path that further includes BLM layer 125, C4s 128, metal wiring layers 117-118, and contact pads 116. The electroplating technique causes electrical current to flow through the electrical path to contact pads 116. Contact pads 116 act as cathodes in the electroplating process upon which plated-conductive material 108 (e.g., copper) deposits from and an electroplating solution that can include, but is not limited to, copper sulfate ($CuSO_4$) or sulfuric acid ($H_2SO_4$). Thus, electrical current applied to contact pads 116 causes TSVs 109 to be filled with plated-conductive material 108 (e.g., copper) from the electroplating solution.

Figure 1Q:
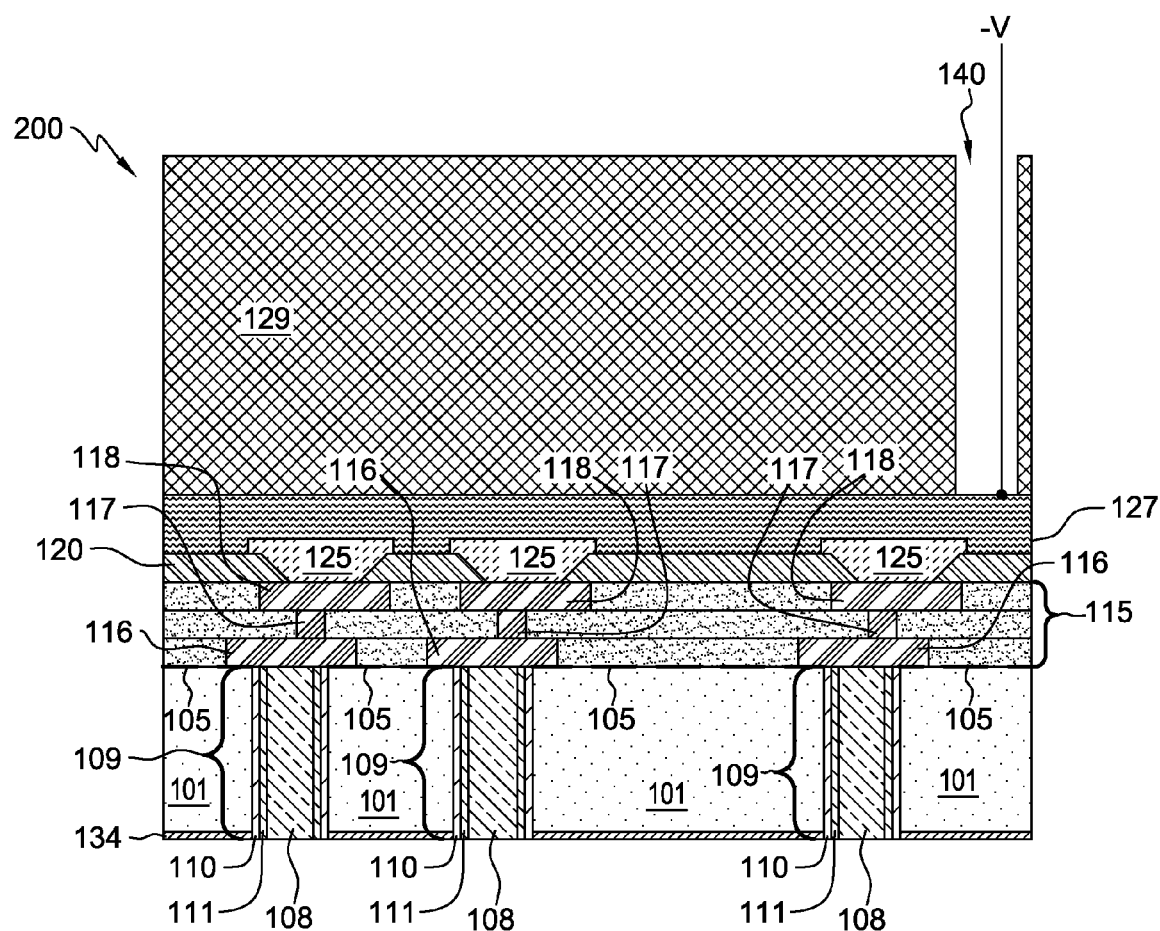

FIG. 1Q is an alternative embodiment that illustrates a cross-sectional view of a semiconductor 200, wherein TSVs 109 are formed before any BEOL processing or formed after mechanical support carrier-attach and backside thinning Semiconductor 200 includes substrate 101, dielectric layer 134, optional dielectric layer 110, diffusion barrier layer 111, BEOL wiring level 115, PSPI layer 120, BLM layer 125, adhesive layer 127, and mechanical support carrier layer 129 having an opening 140 selective to the adhesive layer. If TSVs 109 are formed before BEOL processing, BEOL wiring level 115 is formed on first-surface 105 of substrate 101 and TSVs 109. BEOL wiring level 115 includes contact pads 116 and metal wiring layers 117-118, wherein the contact pads are formed on TSVs 109. Contact pads 116 and metal wiring layers 117-118 are copper, but the contact pads and the metal wiring layers can be formed utilizing other conductive materials, such as tungsten or aluminum.

Moreover, contact pads 116 are part of an electrical path to perform an electroplating technique to fill TSVs 109 with plated-conductive material 108 (e.g., copper) from an electroplating solution that includes, but is not limited to, copper sulfate ($CuSO_4$) or sulfuric acid ($H_2SO_4$). Specifically, a negative voltage is applied to adhesive layer 127 through opening 140, which causes electrical current to flow through the electrical path to contact pads 116. Contact pads 116 act as cathodes in the electroplating process upon which plated-conductive material 108 (e.g., copper) from the electroplating solution deposits and fills TSVs 109. If TSVs 109 are formed after mechanical support carrier-attach and backside thinning then the TSVs are not filled with sacrificial material, and any material in the TSVs disposed proximately to contact pads 116 may be removed to expose copper of the contact pads utilizing anisotropic RIE prior to electroplating.

Figure 1R:
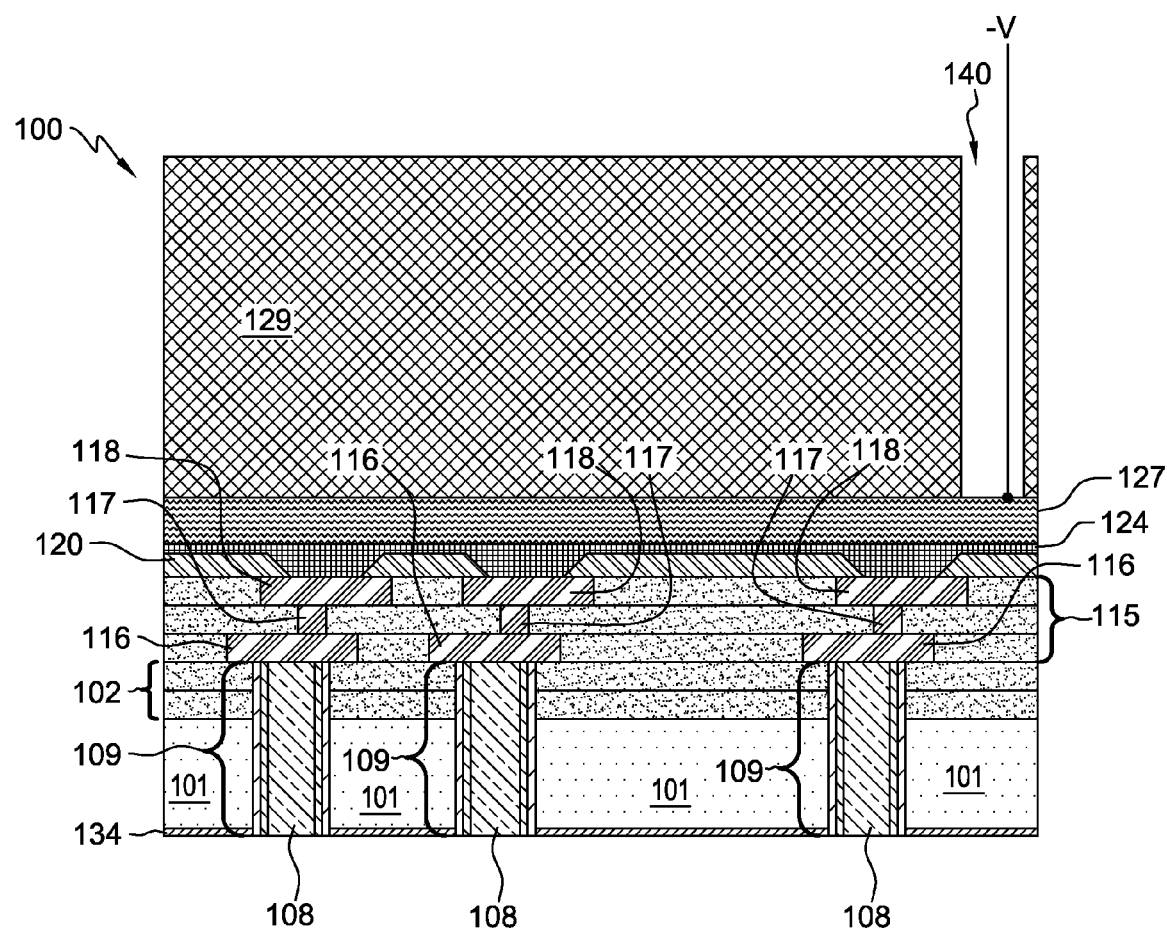

FIG. 1R is an alternative embodiment that illustrates a cross-sectional view of semiconductor 100, wherein BLM seed layer 124 is formed on PSPI layer 120 and on openings 122 (shown in FIG. 1H). Adhesive layer 127 is formed on BLM seed layer 124. BLM seed layer 124 is utilized as a conductor, in an electrical path, to perform an electroplating technique that fills TSVs 109 with plated-conductive material 108 (e.g., copper) from an electroplating solution that includes, but is not limited to, copper sulfate ($CuSO_4$) or sulfuric acid ($H_2SO_4$).

In the present embodiment, adhesive layer 127 is conductive and can include, but is not limited to, an adhesive matrix that contains metallic particles, resulting in a bulk resistivity that is about $1e^{-2}$ to $1e^{-4}$ ohm-cm. In addition, adhesive layer 127 can include a polymer resin such as epoxy, ester, polyimide, or silicone. Since adhesive layer 127 is conductive the adhesive layer can further include copper, nickel, or silver. Moreover, opening 140 is formed in mechanical support carrier layer 129 selective to the adhesive layer, or the opening may be formed in the mechanical support carrier layer prior to joining the mechanical support carrier layer to the adhesive layer. A negative voltage is applied to adhesive layer 127 to perform electroplating, which causes a current to flow through the adhesive layer and BLM seed layer 124 to contact pads 116.

However, adhesive layer 127 is conductive in some embodiments, but not all embodiments. Thus, if adhesive layer 127 is non-conductive then opening 140 is formed in mechanical support carrier layer 129 and the adhesive layer, selective to BLM seed layer 124. A non-conductive adhesive layer 127 can include, but is not limited to, a polymer resin such as epoxy, ester, polyimide, or silicone. Moreover, if adhesive layer 127 is non-conductive, a negative voltage is applied directly to BLM seed layer 124 to perform electroplating, which causes current to flow through the BLM seed layer to contact pads 116.

Accordingly, BLM seed layer 124 is part of an electrical path that further includes metal wiring layers 117-118, and contact pads 116. The electrical path allows for an electroplating technique to be performed, which causes electrical current to flow through the electrical path to contact pads 116. Contact pads 116 act as cathodes in the electroplating process upon which plated-conductive material 108 (e.g., copper) deposits. Thus, current that is applied to contact pads 116 causes TSVs 109 to be filled with plated-conductive material 108 (e.g., copper) from an electroplating solution that can include, but is not limited to, copper sulfate ($CuSO_4$) or sulfuric acid ($H_2SO_4$).

Figure 1S:
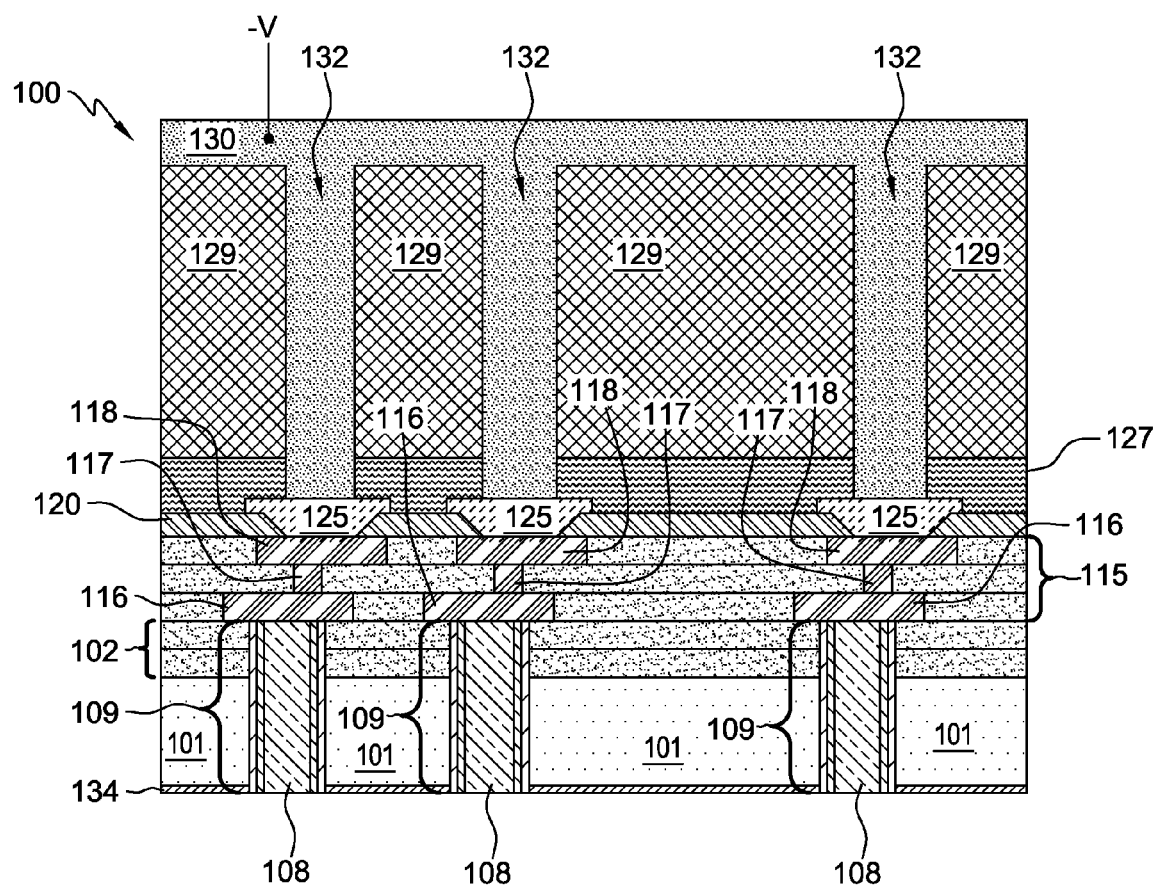

FIG. 1S is an alternative embodiment that illustrates a cross-sectional view of semiconductor 100 with a conducting plate 130, coupled to feed-through conductors 132, wherein the conducting plate is placed on mechanical support carrier layer 129. Feed-through conductors 132 can include one or more metallic pins, or a conductive medium. Furthermore, the conductive medium can include a conductive paste, conductive adhesive, or any conductor in powder, liquid or gel form that can provide a good electrical connection for curved surfaces such as that of C4s 128 (shown in FIG. 1T). Adhesive layer 127 connects mechanical support carrier layer 129 to PSPI layer 120 and BLM layer 125. Mechanical support carrier layer 129 includes prefabricated holes that can be aligned over openings 122 (shown in FIG. 1H), wherein BLM layer 125 is formed on the openings. Thus, after mechanical support carrier layer 129 is connected to adhesive layer 127, portions of the adhesive layer are exposed through prefabricated holes in the mechanical support carrier layer. Portions of adhesive layer 127 that are exposed through prefabricated holes are removed selective to BLM layer 125, utilizing an etching/removal technique that can include plasma etching.

Moreover, conducting plate 130 is coupled to feed-through conductors 132 that are in prefabricated holes formed in mechanical support carrier layer 129. Feed-through conductors 132 connect conducting plate 130 to BLM layer 125, which allows electroplating to be performed to fill TSVs 109. Specifically, an electroplating technique is utilized to fill TSVs 109 with plated-conductive material 108 (e.g., copper), wherein a negative voltage is applied to conducting plate 130. Conducting plate 130 is part of an electrical path that includes feed-through conductors 132, BLM layer 125, metal wiring layers 117-118, and contact pads 116. Thus, the electroplating technique causes electrical current to flow through the electrical path to contact pads 116. Contact pads 116 act as cathodes in the electroplating process upon which the plated-conductive material 108 (e.g., copper) deposits. Current applied to contact pads 116 causes TSVs 109 to be filled with plated-conductive material 108 (e.g., copper) from an electroplating solution that can include, but is not limited to, copper sulfate ($CuSO_4$) or sulfuric acid ($H_2SO_4$).

Figure 1T:
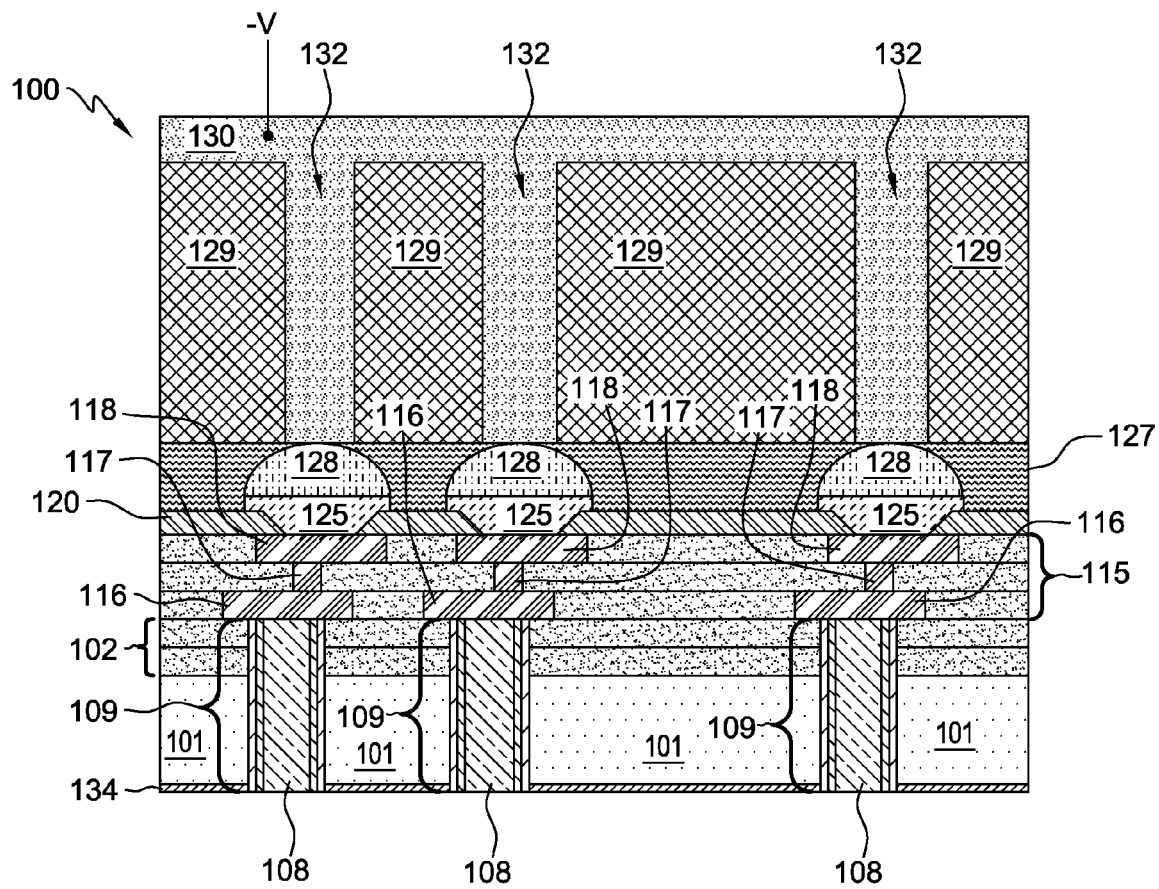

FIG. 1T is an alternative embodiment that illustrates a cross-sectional view of semiconductor 100, wherein C4s 128 are formed on BLM layer 125, an adhesive layer 127 is formed on PSPI layer 120 and the C4s, a mechanical support carrier layer 129 is formed on the adhesive layer, and a conducting plate 130 is placed on mechanical support carrier layer 129. Conducting plate 130 is coupled to feed-through conductors 132. Feed-through conductors 132 can include one or more metallic pins, or a conductive medium. Furthermore, the conductive medium can include a conductive paste, conductive adhesive, or any conductor in powder, liquid or gel form that can provide a good electrical connection for curved surfaces such as that of C4s 128. Adhesive layer 127 connects mechanical support carrier layer 129 to PSPI layer 120 and C4s 128. Mechanical support carrier layer 129 includes prefabricated holes that can be aligned over openings 122 (shown in FIG. 1H). BLM layer 125 is formed on openings 122, and C4s 128 are formed on the BLM layer. Thus, after mechanical support carrier layer 129 is connected to adhesive layer 127, portions of the adhesive layer are exposed through prefabricated holes in the mechanical support carrier layer. Portions of adhesive layer 127 that are exposed through prefabricated holes in mechanical support carrier layer 129 are removed selective to C4s 128, utilizing an etching/removal technique that can include plasma etching.

Moreover, conducting plate 130 is coupled to feed-through conductors 132 that are in prefabricated holes formed in mechanical support carrier layer 129. Feed-through conductors 132 connect conducting plate 130 to C4s 128, which allows electroplating to be performed to fill TSVs 109. Specifically, an electroplating technique is utilized to fill TSVs 109 with plated-conductive material 108 (e.g., copper), wherein a negative voltage is applied to conducting plate 130. Conducting plate 130 is part of an electrical path that includes feed-through conductors 132, C4s 128, BLM layer 125, metal wiring layers 117-118, and contact pads 116. The electroplating technique causes electrical current to flow through the electrical path to contact pads 116. Contact pads 116 act as cathodes in the electroplating process upon which plated-conductive material 108 (e.g., copper) deposits. Current applied to contact pads 116 causes TSVs 109 to be filled with plated-conductive material 108 (e.g., copper) from an electroplating solution that can include, but is not limited to, copper sulfate ($CuSO_4$) or sulfuric acid ($H_2SO_4$).

Generally, after filling TSVs 109 with plated-conductive material 108 (e.g., copper) additional interconnect structures may be formed. Furthermore, conducting plate 130 is removed from semiconductor 100. Semiconductor 100, while still attached to mechanical support carrier layer 129, may then be diced into individual chips. The chips can be joined to other chips or substrates. Subsequently, mechanical support carrier layer 129 and adhesive layer 127 may be removed with the use of solvents or other methods recommended by an adhesive manufacturer. Removal of mechanical support carrier layer 129 may be followed by final surface cleaning using a solvent-based or plasma-based cleaning process. In the case where a continuous metallic film (e.g., BLM seed layer 124 shown in FIG. 1R) is present, on PSPI layer 120, an additional etching operation is required to remove the film.

Furthermore, those skilled in the art will note from the above description, that presented herein is a method for forming TSVs for 3D integrated circuits utilizing copper contact pads in a BEOL wiring level, to fill the TSVs with plated-conductive material. The electroplating method can be utilized to fill high aspect ratio TSVs, which can increase the silicon area that is available for forming additional electronic components on integrated circuits, and increase the amount of functionality provided by the integrated circuits. In addition, utilizing contact pads in a BEOL wiring level to perform electroplating to fill TSVs can mitigate void formation and chemical entrapment in the TSVs, and minimize semiconductor fabrication process steps. Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A method of forming a via structure, the method comprising the steps of:
    forming a through-silicon via in a substrate, wherein the substrate has a first-surface and a second-surface;
    forming a back-end-of-line (BEOL) wiring level on the first-surface of the substrate, wherein the BEOL wiring level includes a contact pad;
    forming a photosensitive polyimide layer on the BEOL wiring level;
    forming an opening in the photosensitive polyimide layer;
    forming a ball limiting metallization (BLM) layer on the opening in the photosensitive polyimide layer;
    forming an adhesive layer on the photosensitive polyimide layer and the BLM layer;
    forming a mechanical support carrier layer on the adhesive layer;
    forming an electrical path through the mechanical support carrier layer, wherein the electrical path includes the contact pad; and
    performing an electroplating technique to fill the through-silicon via with a plated-conductive material.

2. The method of claim 1, wherein forming the through-silicon via comprises:
    forming an opening in the substrate utilizing an etching/removal technique that includes RIE or wet etching;
    depositing an optional dielectric layer directly adjacent to sidewalls of the opening in the substrate utilizing a chemical vapor deposition technique;
    depositing a diffusion barrier layer directly adjacent to the optional dielectric layer, or directly adjacent to the sidewalls of the opening in the substrate;
    depositing a sacrificial layer directly adjacent to the diffusion barrier layer and proximate to the contact pad;
    recessing the second-surface of the substrate to form a third-surface of the substrate;
    depositing a dielectric layer proximate to the third-surface of the substrate; and
    removing the sacrificial layer selective to the contact pad prior to performing the electroplating technique.

3. The method of claim 2, wherein the diffusion barrier layer comprises tantalum (Ta), tantalum nitride (TaN), ruthenium (Ru), titanium (Ti), or titanium nitride (TiN) deposited utilizing a technique that includes CVD, physical vapor deposition (PVD), or atomic layer deposition (ALD).

4. The method of claim 2, wherein the sacrificial layer comprises poly-silicon, polyimide, or an oxide that is deposited utilizing CVD, physical vapor deposition (PVD), or spin-on approaches.

5. The method of claim 1, wherein forming the BEOL wiring level comprises:
   forming the contact pad on the through-silicon via; and
   forming a metallization layer that includes the contact pad.

6. The method of claim 5, wherein forming the BLM layer comprises:
   connecting the BLM layer to the metallization layer through the opening in the photosensitive polyimide layer; or
   connecting the BLM layer to the metallization layer through the opening in the photosensitive polyimide layer, wherein a collapse chip connection (C4) is formed on the BLM layer and is present during the electroplating technique.

7. The method of claim 1, wherein the forming the through-silicon via is performed before FEOL processing, during FEOL processing, after FEOL processing but before BEOL processing, during BEOL processing, after BEOL processing, or after mechanical support carrier-attach and backside thinning.

8. The method of claim 1, wherein forming the mechanical support carrier layer comprises creating an opening in the mechanical support carrier layer that exposes a portion of the adhesive layer.

9. The method of claim 8, wherein performing the electroplating technique to fill the through-silicon via comprises applying a voltage to the adhesive layer through the opening in the mechanical support carrier layer, which causes current to flow to the contact pad and the plated-conductive material from an electroplating solution to fill the through-silicon via.

* * * * *